United States Patent
Nakamura

(10) Patent No.: US 9,714,877 B2
(45) Date of Patent: Jul. 25, 2017

(54) TORQUE SENSOR HAVING DUAL, HELICALLY-WOUND DETECTION COILS

(71) Applicant: Hitachi Metals, Ltd., Tokyo (JP)

(72) Inventor: Teruyuki Nakamura, Hitachi (JP)

(73) Assignee: HITACHI METALS, LTD, Tokyo (JP)

( * ) Notice: Subject to any disclaimer, the term of this patent is extended or adjusted under 35 U.S.C. 154(b) by 0 days.

(21) Appl. No.: 15/088,344

(22) Filed: Apr. 1, 2016

(65) Prior Publication Data
US 2016/0305833 A1    Oct. 20, 2016

(30) Foreign Application Priority Data
Apr. 14, 2015   (JP) .................. 2015-082247

(51) Int. Cl.
G01L 3/00    (2006.01)
G01L 3/10    (2006.01)
G01R 3/00    (2006.01)

(52) U.S. Cl.
CPC .............. G01L 3/103 (2013.01); G01L 3/102 (2013.01); *G01L 3/105* (2013.01); *G01R 3/00* (2013.01); *Y10T 29/4902* (2015.01)

(58) Field of Classification Search
CPC ......... G01L 3/102; G01L 3/103; G01L 3/105; G01R 3/00; Y10T 29/4902
USPC ...................... 73/862.331–862.335
See application file for complete search history.

(56) References Cited

U.S. PATENT DOCUMENTS

| | | | | |
|---|---|---|---|---|
| 5,442,966 A * | 8/1995 | Hase | ........................ | G01L 3/105 73/862.333 |
| 6,412,356 B1 * | 7/2002 | Kouketsu | ................ | G01L 3/102 73/862.193 |
| 7,389,702 B2 * | 6/2008 | Ouyang | .................. | G01L 3/102 73/862.331 |
| 2004/0007083 A1 * | 1/2004 | Viola | ....................... | G01L 3/105 73/862.335 |
| 2007/0022809 A1 * | 2/2007 | Yoshida | .................. | G01L 3/102 73/200 |
| 2013/0152703 A1 * | 6/2013 | Arimura | .................. | G01L 3/102 73/862.333 |

FOREIGN PATENT DOCUMENTS

JP      2008-089305 A     4/2008

* cited by examiner

*Primary Examiner* — Max Noori
(74) *Attorney, Agent, or Firm* — Roberts Mlotkowski Safran Cole & Calderon P.C.

(57) ABSTRACT

A torque sensor for being attached around a magnetostrictive rotating shaft includes a bobbin that is provided coaxially with the rotating shaft, wherein the bobbin includes a resin, a hollow cylindrical shape, and first inclined grooves and second inclined grooves formed on an outer peripheral surface thereof, wherein the first inclined grooves are inclined at a predetermined angle relative to an axial direction, and wherein the second inclined grooves are inclined at a predetermined angle relative to the axial direction in an opposite direction of the first inclined grooves, a first detection coil including an insulated wire wound around the bobbin along the first inclined grooves, a second detection coil including the insulated wire wound around the bobbin along the second inclined grooves, and a measurement portion that detects a inductance variation of the first and second detection coils so as to measure a torque applied to the rotating shaft.

10 Claims, 4 Drawing Sheets

TORQUE SENSOR HAVING DUAL, HELICALLY-WOUND DETECTION COILS

The present application is based on Japanese patent application No. 2015-082247 filed on Apr. 14, 2015, the entire contents of which are incorporated herein by reference.

BACKGROUND OF THE INVENTION

1. Field of the Invention

The invention relates to a magnetostrictive torque sensor.

2. Description of the Related Art

Known magnetostrictive torque sensors are provided with a rotating shaft having a magnetostrictive characteristic that a magnetic permeability varies according to an applied torque, and a detection coil, wherein the detection coil can detect a variation in magnetic permeability of the rotating shaft under the applied torque as a variation in inductance thereof, thereby detecting a torque (rotation torque) applied to the rotating shaft.

When a torque is applied to the rotating shaft, a compressive (or tensile) stress acts in a direction inclined at +45 degrees relative to an axial direction and a tensile (or compressive) stress acts in a direction inclined at −45 degrees relative to the axial direction. Thus, the torque sensor is configured such that variations in magnetic permeability in the directions inclined at +45 degrees and −45 degrees relative to the axial direction are respectively detected by two detection coils and a difference in voltage between two ends is measured on the both detection coils by using a bridge circuit etc., whereby the torque applied to the rotating shaft can be detected at high sensitivity.

A magnetostrictive torque sensor is disclosed in JP-B-4,888,015.

JP-B-4,888,015 proposes a substrate-coil type torque sensor in which a detection coil is formed using a wiring pattern formed on a flexible circuit board so as to have a side inclined at +45 degrees relative to the axial direction of the rotating shaft and a side inclined at −45 degrees and the flexible circuit board is attached to an inner peripheral surface of a magnetic ring.

SUMMARY OF THE INVENTION

The magnetostrictive torque sensors are characterized in that it is possible to detect a large torque, as compared to other types of torque sensors using a Hall IC etc. The present inventors considered such characteristics of magnetostrictive torque sensors to be useful for detecting the torque of a powertrain system or to detect the torque of an engine shaft.

In the usage, however, the torque sensors may be dipped in oil such as lubricant oil, or the oil may be splashed on the torque sensor. The torque sensors need to have oil resistance.

Since the torque sensor disclosed in JP-B-4,888,015 uses the flexible circuit board, the oil resistance may be questioned about a film-shaped resin used for the flexible circuit board. Thus, the film-shaped resin needs to be improved in terms of reliability.

It is an object of the invention to provide a torque sensor that is excellent in oil resistance.

According to an embodiment of the invention, a torque sensor for being attached around a magnetostrictive rotating shaft comprises:

a bobbin that is provided coaxially with and at a distance from the rotating shaft, wherein the bobbin comprises a resin, a hollow cylindrical shape, and a plurality of first inclined grooves and a plurality of second inclined grooves formed on an outer peripheral surface thereof, wherein the first inclined grooves are inclined at a predetermined angle relative to an axial direction, and wherein the second inclined grooves are inclined at a predetermined angle relative to the axial direction in an opposite direction of the first inclined grooves;

a first detection coil comprising an insulated wire wound around the bobbin along the first inclined grooves;

a second detection coil comprising the insulated wire wound around the bobbin along the second inclined grooves; and a measurement portion that detects a inductance variation of the first and second detection coils so as to measure a torque applied to the rotating shaft.

Effects of the Invention

According to an embodiment of the invention, a torque sensor can be provided that is excellent in oil resistance.

BRIEF DESCRIPTION OF THE DRAWINGS

Next, the present invention will be explained in more detail in conjunction with appended drawings, wherein.

DETAILED DESCRIPTION OF THE PREFERRED EMBODIMENTS

Embodiment

An embodiment of the invention will be described in conjunction with the appended drawings.

General Configuration of Torque Sensor

Figure 1A:
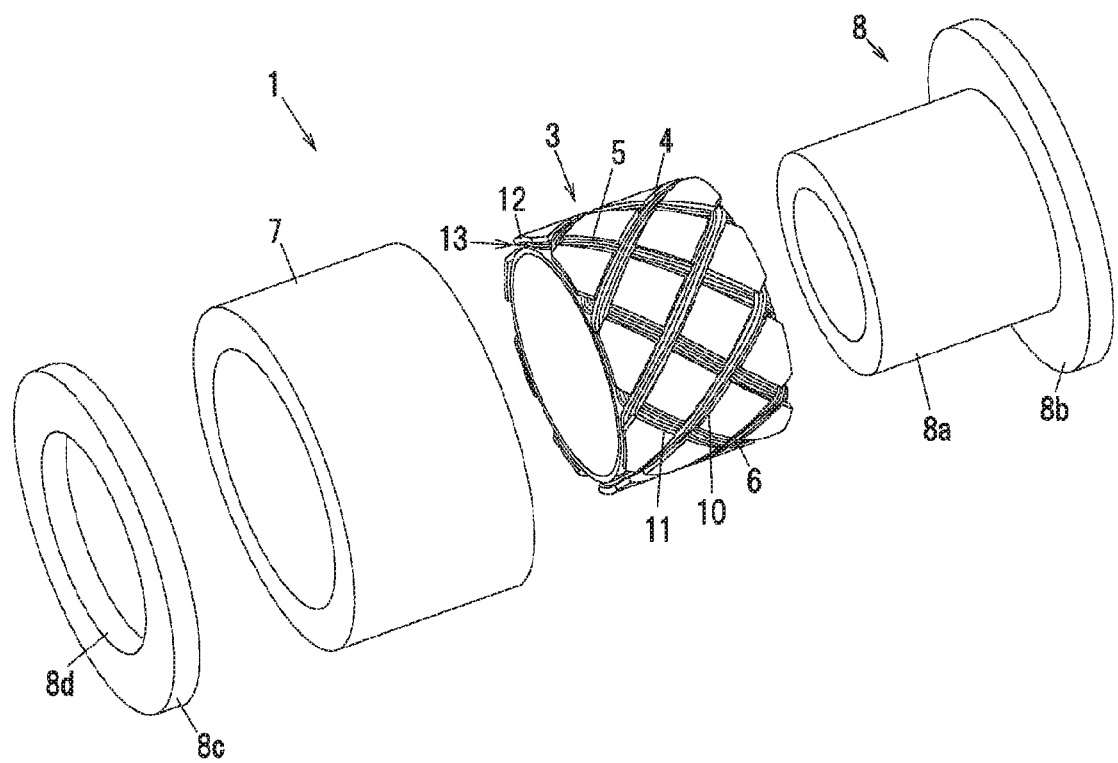
FIG. 1A is an exploded perspective view showing a torque sensor in an embodiment of the present invention.
Figure 1B:
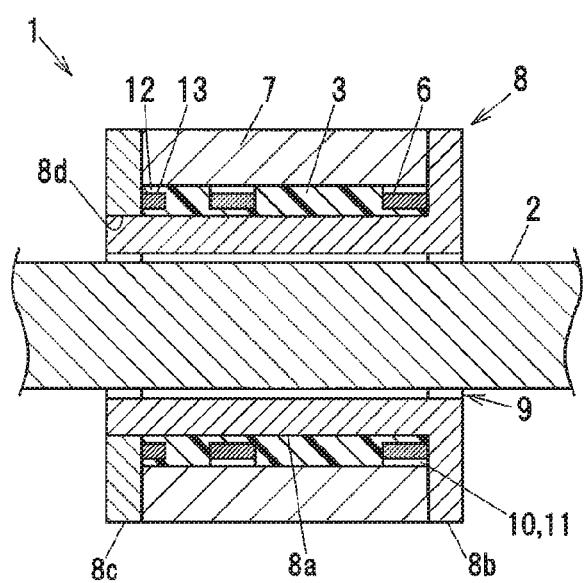
FIG. 1B is a cross sectional view showing the torque sensor when attached to a rotating shaft.

FIGS. 1A and 1B are diagrams illustrating a torque sensor in the present embodiment, wherein FIG. 1A is an exploded perspective view and FIG. 1B is a cross sectional view when attached to a rotating shaft As shown in FIGS. 1A and 1B, a torque sensor 1 is attached around a magnetostrictive rotating shaft 2 to measure torque (rotation torque) applied to the rotating shaft 2.

The torque sensor 1 is provided with a bobbin 3 formed of a resin, detection coils 4 and 5 formed by winding insulated wires 6 around the bobbin 3, a magnetic ring 7 and a fixing ring 8.

The rotating shaft 2 is formed of a magnetostrictive material and has a columnar shape (bar shape). Examples of the magnetostrictive material include nickel, an iron-aluminum alloy and an iron-cobalt alloy, etc. The material used to form the rotating shaft 2 may be either a positive magnetostrictive material of which magnetic permeability decreases under compression and increases under tension, or a negative magnetostrictive material of which magnetic permeability increases under compression and decreases under tension. The rotating shaft 2 is, e.g., a shaft used to transfer torque in a powertrain system, or a shaft used to transfer torque of engine in a vehicle.

The magnetic ring 7 is formed of a magnetic material (ferromagnetic material) and is formed into a hollow cylindrical shape. The bobbin 3 having the detection coils 4 and 5 thereon is inserted into the hollow of the magnetic ring 7 which is thus arranged to cover the outer peripheral surface of the bobbin 3. The magnetic ring 7 is formed so that an inner diameter thereof is substantially the same as (but slightly larger than) an outer diameter of the bobbin 3. The magnetic ring 7 serves to prevent a magnetic flux generated by the detection coils 4 and 5 from leaking to the outside and thereby to suppress a decrease in sensitivity.

The fixing ring 8 is used to fix the bobbin 3 to the magnetic ring 7, and is provided with a hollow cylinder 8a to be inserted into the hollow of the bobbin 3, a first annular flange 8b integrally provided at an end portion of the cylinder 8a, and a second annular flange 8c having an insertion hole 8d into which another end portion of the cylinder 8a is inserted and fitted.

The bobbin 3 is inserted into the hollow of the magnetic ring 7. Then, the cylinder 8a of the fixing ring 8 is inserted into the hollow of the bobbin 3. Then, a front end portion (the other end portion) of the cylinder 8a is inserted into the insertion hole 8d and is fitted to the second flange 8c. Accordingly, the magnetic ring 7 and the bobbin 3 are sandwiched between the two flanges 8b and 8c and the bobbin 3 is also sandwiched between the outer peripheral surface of the cylinder 8a and the inner peripheral surface of the magnetic ring 7. The bobbin 3 is thereby fixed to the magnetic ring 7.

The cylinder 8a is formed so that an outer diameter thereof is substantially the same as (but slightly smaller than) an inner diameter of the bobbin 3. Meanwhile, the flanges 8b and 8c are formed so that an outer diameter thereof is substantially the same as an outer diameter of the magnetic ring 7.

The torque sensor 1 is configured so that the rotating shaft 2 is inserted into the hollow of the cylinder 8a. The cylinder 8a is formed so that an inner diameter thereof is slightly larger than an outer diameter of the rotating shaft 2. The torque sensor 1 is configured that a gap 9 is formed between the inner wall of the cylinder 8a and the rotating shaft 2 and the torque sensor 1 does not come into contact with the rotating shaft 2. The torque sensor 1 is fixed to a fixed member such as a housing and does not rotate with rotation of the rotating shaft 2.

In the present embodiment, the fixing ring 8 is provided between the bobbin 3 (the detection coils 4 and 5) and the rotating shaft 2. Thus, the fixing ring 8 needs to be formed of a resin which does not have an effect on a magnetic flux generated by the detection coils 4 and 5. Meanwhile, when the torque sensor 1 is used in an environment in which the torque sensor 1 comes into contact with oil such as lubricant oil, it is necessary to use the fixing ring 8 which is formed of an oil resistant material. Furthermore, when the torque sensor 1 is used in a high-temperature environment, it is desirable to use the fixing ring 8 which is formed of a heat resistant material. The fixing ring 8 used in the present embodiment is formed of the same material as the bobbin 3.

Although the configuration in which the bobbin 3 is fixed to the magnetic ring 7 using the fixing ring 8 has been described here, the structure of fixing the bobbin 3 to the magnetic ring 7 is not limited thereto. For example, the bobbin 3 and the magnetic ring 7 may be fixed to each other by covering with a mold resin.

Configurations of Bobbin 3 and Detection Coils 4 and 5

Figure 2:
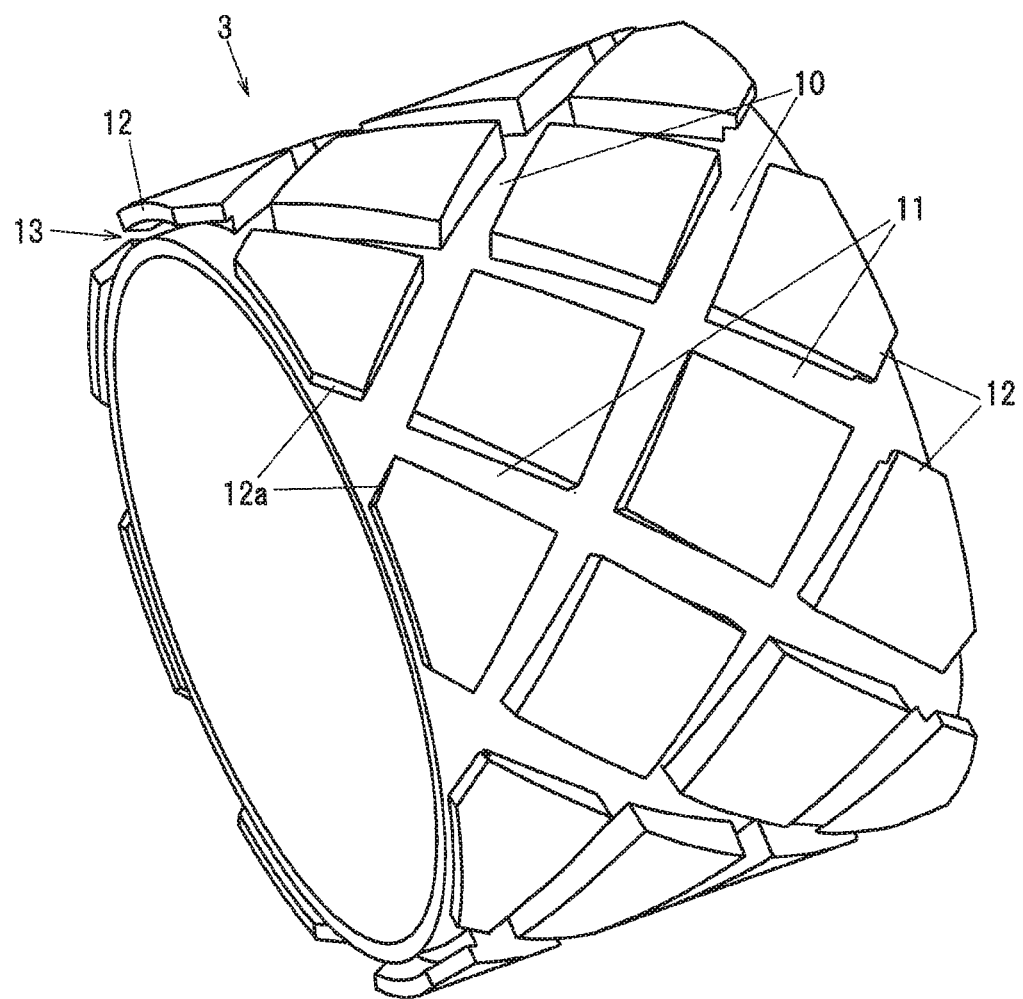
FIG. 2 is a perspective view showing a bobbin.

As shown in FIGS. 1A to 2, the bobbin 3 is formed of a resin and has a hollow cylindrical shape overall. The bobbin 3 is provided coaxially with and at a distance from the rotating shaft 2.

Plural first inclined grooves 10 and plural second inclined grooves 11 are formed on the outer peripheral surface of the bobbin 3. The first inclined grooves 10 are inclined at a predetermined angle relative to an axial direction of the rotating shaft 2, and the second inclined grooves 11 are inclined at a predetermined angle relative to the axial direction in a direction opposite to the first inclined grooves 10 (but at the same angle as the first inclined grooves 10).

Figure 3A:
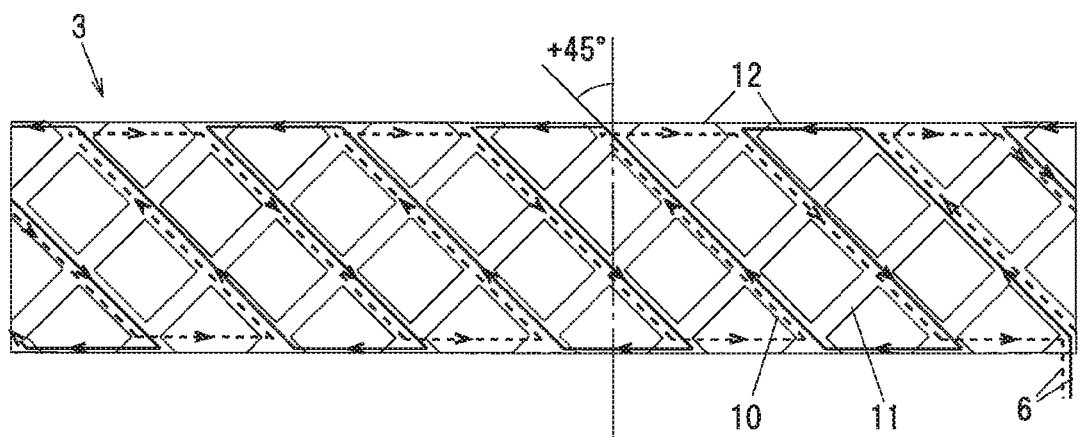
FIG. 3A is an illustration diagram showing how to wind an insulated wire to form a first detection coil.
Figure 3B:
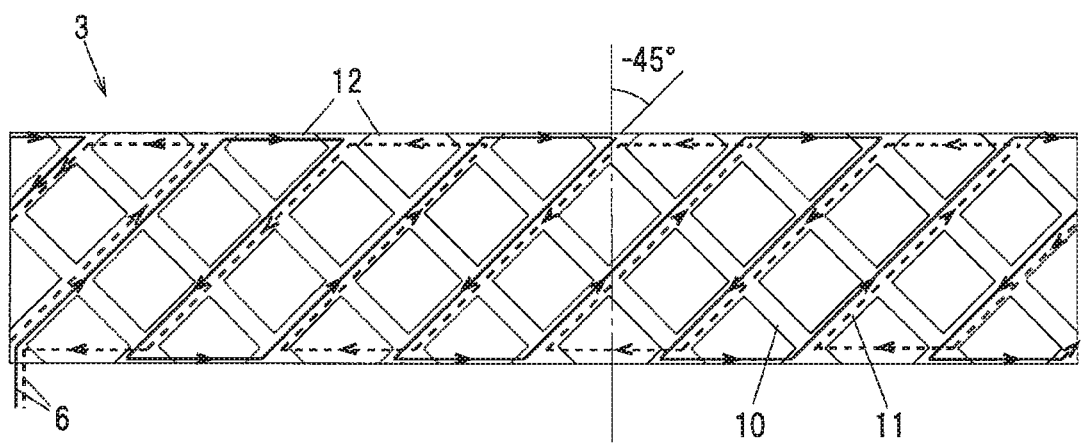
FIG. 3B is an illustration diagram showing how to wind an insulated wire to form a second detection coil.

In the present embodiment, the first inclined grooves 10 are formed to be inclined at +45 degrees relative to the axial direction, and the second inclined grooves 11 are formed to be inclined at −45 degrees relative to the axial direction (see FIGS. 3A and 3B). In the torque sensor 1, the detection coils 4 and 5 are formed by winding the insulated wires 6 along the inclined grooves 10 and 11. Since variation in magnetic permeability when torque is applied to the rotating shaft 2 is the largest in directions of ±45 degrees relative to the axial direction, ±45 degree inclination of the inclined grooves 10 and 11 relative to the axial direction allows detection sensitivity to be improved.

The inclination angle of the inclined grooves 10 and 11 is not limited to ±45 degrees. However, sensitivity decreases when the inclination angle of the inclined grooves 10 and 11 is too large or too small. Therefore, the inclination angle of the inclined grooves 10 and 11 is desirably in a range of ±30 to 60 degrees.

In the present embodiment, eight first inclined grooves 10 are formed at equal intervals in a circumferential direction and eight second inclined grooves 11 are formed at equal intervals in the circumferential direction, so that a mesh of grooves on the whole is formed on the outer peripheral surface of the bobbin 3. However, the numbers of the inclined grooves 10 and 11 are not limited thereto and can be appropriately changed according to the outer diameter of the bobbin 3 (the outer diameter of the rotating shaft 2), etc.

Locking walls 12 are provided between the first inclined grooves 10 and the second inclined grooves 11 at both axial edges of the bobbin 3 to prevent the insulated wires 6 from falling at the time of winding the insulated wires 6. Each locking wall 12 is formed by providing a notch 13 opening laterally (axially outward) on a thick portion between the first inclined groove 10 and the second inclined groove 11 at the middle in the thickness direction. The notch 13 is formed along the circumferential direction so as to connect the first inclined groove 10 to the second inclined groove 11. Corners 12a of each locking wall 12 are chamfered so that the insulated wires 6 can be wound easily.

In the present embodiment, the detection coils 4 and 5 are formed on the outer peripheral surface of the bobbin 3. Thus, the bobbin 3 need to be formed of a resin which does not have an effect on a magnetic flux generated by the detection coils 4 and 5. Meanwhile, when the torque sensor 1 is used in an environment in which the torque sensor 1 comes into contact with oil such as lubricant oil, it is necessary to use the bobbin 3 which is formed of an oil resistant material. Furthermore, when the torque sensor 1 is used in a high-temperature environment, it is desirable to use the bobbin 3 which is formed of a heat resistant material.

Furthermore, it is desirable to use the bobbin 3 having a linear expansion coefficient equivalent to that of copper (the insulated wire 6) so that the insulated wires 6 are not broken by thermal deformation of the bobbin 3. In more detail, a resin used to form the bobbin 3 desirably has a linear expansion coefficient of within ±25% of the linear expansion coefficient of copper. Since the linear expansion coefficient of copper is $1.66\times10^{-5}$ to $1.68\times10^{-5}/°$ C., a resin having a linear expansion coefficient of not less than $1.25\times10^{-5}/°$ C. and not more than $2.1\times10^{-5}/°$ C. is desirably used to form the bobbin 3.

Examples of resins satisfying such conditions include a polyphthalamide resin (PPA), a polyether ether ketone resin (PEEK) and a polyphenylene sulfide resin (PPS), etc. Of those, PPA and PPS have a linear expansion coefficient of $1.3\times10^{-5}$ to $1.5\times10^{-5}/°$ C. It is also possible to adjust the linear expansion coefficient by adding glass fibers to a resin used to form the bobbin 3. By using the bobbin 3 formed of such resins, it is possible to realize the torque sensor 1 with high oil resistance, high heat resistance and high reliability.

The first detection coil 4 is formed by winding the insulated wire 6 around the bobbin 3 along the first inclined grooves 10.

The first detection coil 4 in the present embodiment is formed as shown in FIG. 3A: the insulated wire 6 is firstly placed along one first inclined groove 10 and is then proceeded to the next first inclined groove 10 (on the left in the drawing) via the notch 13. This is repeated until the insulated wire 6 goes around the bobbin 3 and returns to the original first inclined groove 10 (indicated by a solid line), and the insulated wire 6 is thereby wired in a substantially crank (zigzag) shape. Then, the insulated wire 6 is placed along the original first inclined groove 10 again and is then proceeded to the next first inclined groove 10 (on the right in the drawing) via the notch 13 in a direction opposite to the previous wiring direction. This is repeated until the insulated wire 6 returns to the original first inclined groove 10 (indicated by a dashed line). One turn is thereby wound.

The first detection coil 4 is formed by repeating the same wiring work to make plural turns (e.g., seven turns). Note that, the bobbin 3 in FIG. 3A is developed and shown on a plane, and the right and left edges in the drawing are connected.

The bobbin 3 is fixed to a jig when winding the insulated wire 6 around the bobbin 3. At this time, an axial end of the bobbin 3 is locked to the jig so that rotation of the bobbin 3 due to tension of the insulated wire 6 is prevented.

The second detection coil 5 is formed by winding the insulated wire 6 around the bobbin 3 along the second inclined grooves 11.

The second detection coil 5 in the present embodiment is formed as shown in FIG. 3B: the insulated wire 6 is firstly placed along one second inclined groove 11 and is then proceeded to the next second inclined groove 11 (on the right in the drawing) via the notch 13. This is repeated until the insulated wire 6 goes around the bobbin 3 and returns to the original second inclined groove 11 (indicated by a solid line), and the insulated wire 6 is thereby wired in a substantially crank (zigzag) shape. Then, the insulated wire 6 is placed along the original second inclined groove 11 again and is then proceeded to the next second inclined groove 11 (on the left in the drawing) via the notch 13 in a direction opposite to the previous wiring direction. This is repeated until the insulated wire 6 returns to the original second inclined groove 11 (indicated by a dashed line). One turn is thereby wound.

The second detection coil 5 is formed by repeating the same wiring work to make plural turns (e.g., seven turns). Note that, the bobbin 3 in FIG. 3B is developed and shown on a plane, and the right and left edges in the drawing are connected.

The method of winding the insulated wire 6 is not limited to that shown in the drawings. For example, the first detection coil 4 (or the second detection coil 5) may be formed by repeatedly winding an insulated wire around two adjacent first inclined grooves 10 (or the second inclined grooves 11) and then repeating this process. The insulated wire 6 is generally wound using a dedicated winding device, and in this case, use of the method described using FIGS. 3A and 3B is more desirable in view of ease of winding the insulated wire 6. In other words, it is possible to improve productivity by using the method described using FIGS. 3A and 3B to wind the insulated wire 6.

The insulated wire 6 used to form the detection coils 4 and 5 is preferably an insulated wire in which an insulation layer excellent in oil resistance and heat resistance is formed around a copper conductor, or a copper conductor plated with nickel, etc. The insulation layer of the insulated wire 6 can be formed of, e.g., polyester, polyimide or polyamide-imide. Although the insulated wire 6 having an outer diameter of 0.12 mm is used in the present embodiment, the outer diameter of the insulated wire 6 can be appropriately changed.

In the present embodiment, two layers of the first detection coil 4 and two layers of the second detection coil 5, four layers in total, are formed. In the present embodiment, the first detection coil 4 (as the first layer), the second detection coil 5 (as the second layer), another second detection coil 5 (as the third layer) and another first detection coil 4 (as the fourth layer) are formed in this order from the inner side of the bobbin 3, even though the stacking sequence of the detection coils 4 and 5 is not specifically limited. Each of the detection coils 4 and 5 is formed using the insulated wire 6 of the same length so that the resistance value is the same.

Configuration of Measurement Portion

Figure 4:
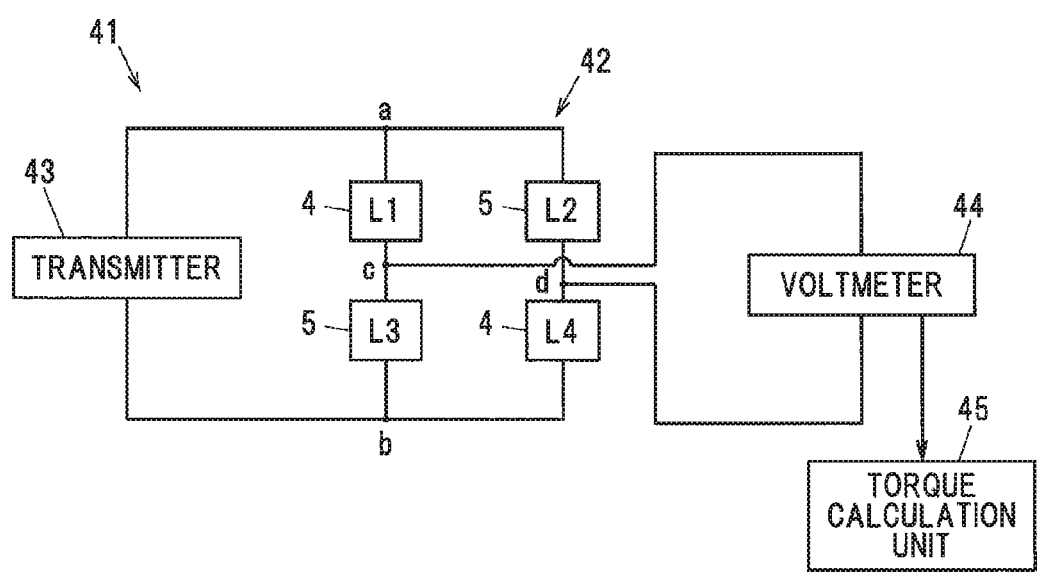
FIG. 4 is an illustration diagram showing a measurement portion.

As shown in FIG. 4, the torque sensor 1 is provided with a measurement portion 41 which detects variation in inductances of the detection coils 4 and 5 and thereby measures torque applied to the rotating shaft 2.

Hereinafter, inductance of the first layer (the first detection coil 4) is denoted by L1, inductance of the second layer (the second detection coil 5) is denoted by L2, inductance of the third layer (the second detection coil 5) is denoted by L3, and inductance of the fourth layer (the first detection coil 4) is denoted by L4.

The measurement portion 41 is provided with a bridge circuit 42, a transmitter 43, a voltage measurement circuit 44 and a torque calculation unit 45. The bridge circuit 42 is composed of the detection coils 4 and 5 and is formed by sequentially and annularly connecting the first layer, the third layer, the fourth layer and the second layer. The transmitter 43 applies AC voltage to a junction a between the detection coils 4 and 5 (the first and second layers) and to a junction b between the detection coils 4 and 5 (the third and fourth layers). The voltage measurement circuit 44 detects voltage at a junction c between the detection coils 4 and 5 (the first and third layers) and at a junction d between the detection coils 4 and 5 (the fourth and second layers). The torque calculation unit 45 calculates torque applied to the rotating shaft 2 based on the voltages measured by the voltage measurement circuit 44.

In the measurement portion 41, when torque is not applied to the rotating shaft 2, the inductances L1 to L4 of the detection coils 4 and 5 are equal to each other and voltage detected by the voltage measurement circuit 44 is substantially zero.

When torque is applied to the rotating shaft 2, magnetic permeability in a direction of +45 degrees relative to the axial direction decreases (or increases) and magnetic permeability in a direction of −45 degrees relative to the axial direction increases (or decreases). Thus, when torque is applied to the rotating shaft 2 in a state in which AC voltage is applied from the transmitter 43, inductances of the first detection coils 4 (the first and fourth layers) decrease (or increase) and inductances of the second detection coils 5 (the second and third layers) increase (or decrease). As a result, voltage detected by the voltage measurement circuit 44 varies. Based on the variation in voltage, the torque calculation unit 45 calculates torque applied to the rotating shaft 2.

Since the detection coils 4 and 5 have entirely the same configuration except the winding direction, an effect of temperature on inductances of the detection coils 4 and 5 can be cancelled out by using the bridge circuit 42 as shown in FIG. 4 and it is thus possible to accurately detect torque applied to the rotating shaft 2. In addition, in the torque sensor 1, when the inductance of the first detection coil 4 increases (or decreases), the inductance of the second detection coil 5 always decreases (or increases). Therefore, it is possible to further improve detection sensitivity by using the bridge circuit 42 as shown in FIG. 4.

Functions and Effects of the Embodiment

In the torque sensor 1 of the present embodiment, the detection coils 4 and 5 are formed by winding the insulated wires 6 around the bobbin 3, as described above.

Due to the configuration in which the detection coils 4 and 5 are formed by winding the insulated wires 6 around the bobbin 3, it is possible to realize the torque sensor 1 with better oil resistance and higher reliability than the conventional substrate-coil type torque sensor using a flexible circuit board.

The torque sensor 1 is particularly suitable for use in an environment with possible exposure to oil such as lubricant oil and can be suitably used to detect, e.g., torque on powertrain system or torque on engine shaft, etc.

In the meantime, some known torque sensors are configured that magnetic portions and non-magnetic portions are alternately arranged on the rotating shaft 2 so as to be inclined relative to the axial direction and torque applied to the rotating shaft is detected by a detection coil arranged coaxially with the rotating shaft 2. To use torque sensors having such a structure, it is necessary to process the rotating shaft 2 or to attach a sheet-shaped member around the rotating shaft 2. In contrast, the torque sensor 1 in the present embodiment does not require to process the rotating shaft 2 and thus has high reliability.

Summary of the Embodiment

Technical ideas understood from the embodiment will be described below citing the reference numerals, etc., used for the embodiment. However, each reference numeral described below is not intended to limit the constituent elements in the claims to the members, etc., specifically described in the embodiment.

[1] A torque sensor (1) to be attached around a magnetostrictive rotating shaft (2) to measure torque applied to the rotating shaft (2), the torque sensor (1) comprising a resin bobbin (3) that is provided coaxially with and at a distance from the rotating shaft (2), is formed into a hollow cylindrical shape, and comprises a plurality of first inclined grooves (10) and a plurality of second inclined grooves (11) on the outer peripheral surface, the first inclined grooves (10) being inclined at a predetermined angle relative to an axial direction and the second inclined grooves (11) being inclined at a predetermined angle relative to the axial direction in a direction opposite to the first inclined grooves (10), a first detection coil (4) formed by winding an insulated wire (6) around the bobbin (3) along the first inclined grooves (10), a second detection coil (5) formed by winding an insulated wire (6) around the bobbin along the second inclined grooves (11), and a measurement portion (41) that detects variation in inductances of the first detection coils (4) and the second detection coils (5) and thereby measures torque applied to the rotating shaft 2.

[2] The torque sensor (1) defined by [1], wherein the first inclined grooves (10) are inclined at +45 degrees relative to the axial direction, and the second inclined grooves (11) are inclined at −45 degrees relative to the axial direction.

[3] The torque sensor (1) defined by [1] or [2], further comprising a magnetic ring (7) comprising a hollow cylindrical magnetic material around the bobbin (3).

[4] The torque sensor (1) defined by any one of [1] to [3], wherein the bobbin (3) comprises a polyphthalamide resin, a polyether ether ketone resin or a polyphenylene sulfide resin.

Although the embodiment of the invention has been described, the invention according to claims is not to be limited to the embodiment. Further, please note that all combinations of the features described in the embodiment are not necessary to solve the problem of the invention.

The invention can be appropriately modified and implemented without departing from the gist of the invention. For example, the measurement portion 41 using the bridge circuit 42 has been described in the embodiment, the configuration of the measurement portion 41 is not limited thereto.

In addition, two each of the first detection coil 4 and the second detection coil 5 are formed in the embodiment, the numbers of the detection coils 4 and 5 are not limited thereto and may be one or not less than three.

What is claimed is:

1. A torque sensor for being attached around a magnetostrictive rotating shaft, comprising:
   a bobbin that is provided coaxially with and at a distance from the rotating shaft, wherein the bobbin comprises a resin, a hollow cylindrical shape, and a plurality of first inclined grooves and a plurality of second inclined grooves formed on an outer peripheral surface thereof, wherein the first inclined grooves are inclined at a predetermined angle relative to an axial direction, and wherein the second inclined grooves are inclined at a predetermined angle relative to the axial direction in an opposite direction of the first inclined grooves;
   a first detection coil comprising an insulated wire wound around the bobbin within the first inclined grooves;
   a second detection coil comprising the insulated wire wound around the bobbin within the second inclined grooves; and
   a measurement portion that detects a inductance variation of the first and second detection coils so as to measure a torque applied to the rotating shaft,
   wherein windings of the first detection coil overlap windings of the second detection coil.

2. The torque sensor according to claim 1, wherein the first inclined grooves are inclined at +45 degrees relative to the axial direction, and wherein the second inclined grooves are inclined at −45 degrees relative to the axial direction.

3. The torque sensor according to claim 1, further comprising a magnetic ring comprising a hollow cylindrical magnetic material around the bobbin.

4. The torque sensor according to claim 1, wherein the bobbin comprises a polyphthalamide resin, a polyether ether ketone resin or a polyphenylene sulfide resin.

5. The torque sensor according to claim 1, further comprising locking walls provided between the first inclined grooves and the second inclined grooves at both axial edges of the bobbin.

6. The torque sensor according to claim 5, wherein the locking walls include lateral notches for receiving the windings of one of the first and second detection coils.

7. The torque sensor according to claim 1, wherein windings of the first and second detection coils traverse both a complete length of the bobbin and part of a circumference of the bobbin.

8. The torque sensor according to claim 1, wherein each winding of the first and second detection coils traverses both a complete length of the bobbin and part of a circumference of the bobbin.

9. The torque sensor according to claim 1, wherein the predetermined angle of the second inclined grooves is the negative of the predetermined angle of the first inclined grooves relative to the axial direction.

10. The torque sensor according to claim 8, wherein the predetermined angle of the first inclined grooves relative to the axial direction is between about 30° and 60°.

* * * * *